United States Patent [19]

Johnson et al.

[11] Patent Number: 4,849,993
[45] Date of Patent: Jul. 18, 1989

[54] CLOCK HOLDOVER CIRCUIT

[75] Inventors: Steven Johnson, Walnut Creek; Toney Warren, Livermore, both of Calif.

[73] Assignee: Silicon General, Inc., San Jose, Calif.

[21] Appl. No.: 131,141

[22] Filed: Dec. 10, 1987

[51] Int. Cl.[4] .............................................. H04L 7/08
[52] U.S. Cl. .................................... 375/108; 331/1 A; 331/11; 375/120
[58] Field of Search ............... 375/106, 108, 110, 119, 375/120; 371/61; 331/1 R, 10, 11, 18, 1 A, 17, 34

[56] References Cited

U.S. PATENT DOCUMENTS

| 3,530,663 | 9/1970 | Marti | 371/61 |
| 4,069,462 | 1/1978 | Dunn | 333/11 |
| 4,135,165 | 1/1979 | Coe | 333/11 |
| 4,667,328 | 5/1987 | Imran | 371/61 |

Primary Examiner—Benedict V. Safourek
Attorney, Agent, or Firm—Hecker & Harriman

[57] ABSTRACT

The present invention provides a clock holdover circuit which will provide a replacement clock signal within predetermined parameters independently of time and temperature variations. The circuit of the present invention has only a single component which is time and temperature dependent. By selecting the components parameters to be within the desired tolerances, the accuracy of the circuit is maintained. In the present invention, digital circuitry is combined with an accurate local crystal frequency source to provide a replacement clock signal. The present invention allows phase consistency upon loss of a reference clock signal as well as on return of the reference clock signal. A reference clock signal is phase locked to a VCO to produce a desired output. The frequency of the output is compared to a local frequency standard to generate an offset frequency used to control a frequency synthesizer. The offset frequency is digitally stored. Upon loss of the reference clock signal, the stored offset frequency is used to drive the frequency synthesizer along with the local frequency standard so as to provide an acceptable replacement clock signal. The frequency comparator, storage, and synthesizer are all digital so as to be time and temperature independent. The local frequency standard is crystal based having known time and temperature tolerances. By choosing a local frequency standard having tolerances within a predetermined range, an acceptable clock holdover signal may be provided indefinitely. The replacement clock signal is phase compared to the reference clock signal so that no loss of phase occurs upon reference loss.

9 Claims, 3 Drawing Sheets

CLOCK HOLDOVER CIRCUIT

BACKGROUND OF THE INVENTION

1. Field of the Invention

This invention relates generally to the field of clock holdover circuits and in particular to a circuit for providing a clock signal of a predetermined accuracy upon loss of a reference clock signal.

2. Background Art

In digital data transmission applications, data is typically transmitted as a series of digital bits to a receiver. Accessing the data requires that the receiver be synchronized with the transmitter. Typically, a clocking signal is provided to both the transmitter and receiver to provide such synchronization.

In telecommunication systems, a highly accurate reference clock signal is provided by a central source, such as, for example, a centrally distributed clock within a network, or an available standard such as GPS, Loran, etc. Clock dependant devices receive the reference clock signal and phase lock onto it. As long as the reference is maintained, the dependant device can operate reliably. If the reference is degraded or lost, errors will occur.

In the prior art, a clock holdover circuit is provided to replace the reference clock signal with a local clock signal upon degradation or loss of the reference signal. In one prior art embodiment, a voltage controlled oscillator (VCO) is phase and frequency locked to the reference clock signal. A phase comparator generates an offset voltage level used to provide a control voltage for the VCO so that the output of the circuit matches the input reference clock signal. The offset voltage is coupled to an analog to digital (A/D) converter, converted to a digital word, and stored in a memory. The input reference clock signal is monitored, and if it degrades or is lost, the digital word stored in memory is output to a digital to analog (D/A) converter. The analog output voltage of the D/A converter is coupled to the VCO to provide the proper offset voltage to the VCO so that the input clock signal will match the lost reference clock signal. The memory stores the current valid offset voltage, determined and stored sufficiently prior to the loss of reference to be accurate. When the reference clock signal is available, the system is dynamic, with the offset voltage changing in response to varying conditions within the circuit. When the reference clock signal is lost, the operation of the system becomes static, depending on the current valid stored offset voltage value.

This prior art clock holdover circuit has a number of disadvantages. All the parts involved have characteristics that change as a function of aging and temperature. Additionally, the time and temperature dependencies of the A/D, D/A and VCO are all independent of each other so that over time, the output generated during the clock holdover phase will change as a function of these variables. In telecommunications systems, it is required that this reference clock signal be highly accurate. Due to the time and temperature degradation of the prior art clock holdover circuit, this accuracy is lost when the reference clock signal is unavailable for extended periods of time.

Therefore, it is an object of the present invention to provide a clock holdover circuit which is time and temperature dependencies can be minimized.

It is another object of the present invention to provide a clock holdover circuit which will provide a holdover clocking signal within established tolerances.

It is a further object of the present invention to provide a clock holdover circuit in which circuit variables can be isolated and controlled.

SUMMARY OF THE PRESENT INVENTION

The present invention provides a clock holdover circuit which will output a replacement clock signal within predetermined parameters. The circuit of the present invention has only a single component which is time and temperature dependent. By selecting the components parameters to be within the desired tolerances, the accuracy of the circuit is maintained. In the present invention, digital circuitry is combined with an accurate local crystal frequency source to provide a replacement clock signal.

A VCO is phase locked to a reference clock signal to produce a desired output. The frequency of the output is compared to a local frequency standard to generate an offset frequency used to control a frequency synthesizer. The offset frequency is digitally stored. The offet frequency is determined to be the difference in frequency between the input reference frequency and the frequency standard. Upon loss of the reference clock signal, the stored offset frequency is used to drive the frequency synthesizer along with the local frequency standard so as to provide an acceptable replacement clock signal. The frequency comparator, storage, and synthesizer are all digital so as to be time and temperature independent. The local frequency standard may be selected to provide the required time and temperature tolerances. By choosing a local frequency standard having tolerances within a predetermined range, an acceptable clock holdover signal may be provided indefinitely.

In the preferred embodiment of the present invention, a reference signal is inputted to a phase comparator and a monitor. The phase comparator is coupled through a switch to a VCO which is phase locked onto the reference clock signal. The output of the VCO is the output of the circuit and is also coupled to a mixer where it is compared to a local frequency standard. The output of the mixer is the difference frequency between the inputs. The difference frequency is coupled to a frequency comparator which determines if the output is above or below the output of the digital synthesizer. The digital synthesizer generates a frequency which is nominally the expected difference frequency between the frequency standard and the input reference frequency. The synthesizer then may be digitally tuned to match the actual frequency difference between the input reference frequency and the standard. The maximum and minimum allowable frequency shift plus the maximum frequency standard define the required tuning range. The output of the frequency comparator is coupled to a digital counter which counts up or down depending on if the output is above or below the frequency standard. The output of the counter and the output of the frequency standard are coupled to a frequency synthesizer. The output of the counter controls the synthesizer frequency in discrete increments associated with the minimum adjustment resolution of the synthesizer. The maximum value, all 1's, and minimum value, all 0's, correspond to the full range, over which the synthesizer may be adjusted. The counter output is stored in a device such that upon loss or degradation of the signal a valid number from a previous time may be used to establish the holdover frequency. The frequency synthesizer output is coupled to a phase comparator along with the output of the mixer. The output of this phase comparator may be selectively coupled to the VCO upon loss of the reference signal. The input VCO will then be phase locked to the synthesizer output. By using the output of the synthesizer to phase lock the VCO, the output frequency will maintain the same offset from the standard that was determined prior to loss of reference.

Any change in the output frequency therefore is completely controlled by the time and temperature characteristics of the frequency reference.

DETAILED DESCRIPTION OF THE PRESENT INVENTION

A clock holdover circuit which is time and temperature independent is described. In the following description, numerous specific details, such as reference frequency, local frequency standard, bus width, etc., are described in detail in order to provide a more thorough description of the present invention. It would be obvious, however, to one skilled in the art, that the present invention may be practiced without these specific details. In other instances, well known features have not been described in detail in order not to unnecessarily obscure the present invention.

The transmission and reception of digital signals reuires that the receiver accurately sample each bit or pulse at the correct position in the incoming pulse train. In many telecommunications applications, a reference clock signal is provided in place of a locally generated timing signal for providing transmitter/receiver synchronization. The devices dependent on the clock reference signal utilize a phase locking circuit to match the phase of the reference clock signal. If the reference clock signal is lost, these dependent devices cannot function accurately. Therefore, many such devices incorporate a clock holdover circuit to replace the reference clock signal if it is lost.

Figure 1:
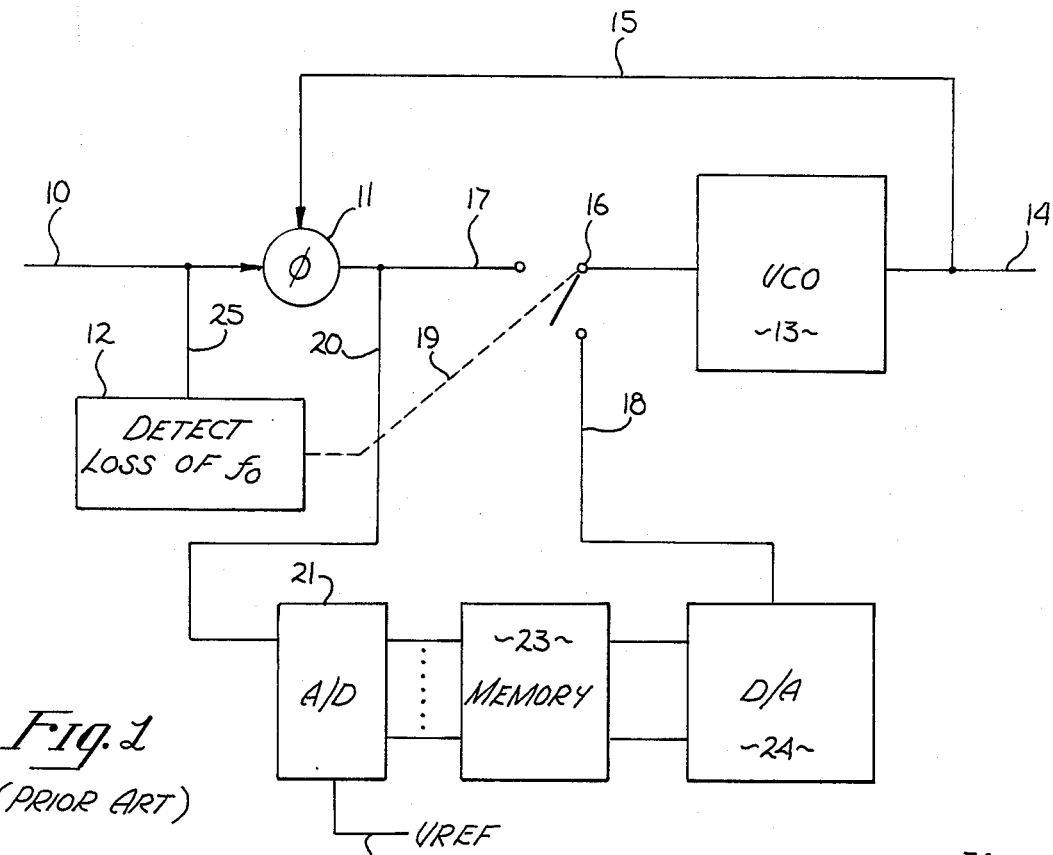
FIG. 1 is a block diagram illustrating a prior art clock holdover circuit.

One prior art clock holdover circuit is illustrated in FIG. 1. This clock holdover circuit utilizes a voltage control oscillator (VCO) to phase lock to a reference clock signal. A phase comparator is utilized to generate an offset voltage signal used to drive the VCO. The most recent offset voltage signal is converted to digital form and stored in a memory. If the reference signal is lost, the stored offset value is converted to analog and coupled to the VCO. The VCO is then utilized to output a replacement clock signal until the reference clock signal can be regained.

Still referring to FIG. 1, a reference clock signal 10 is inputted to a phase comparator 11. The reference clock signal 10 is also coupled on line 25 to detector 12. The output 17 of phase comparator 11 is coupled through switch 16 to VCO 13.

The output 14 of VCO 13 is coupled in feedback fashion on line 15 to phase comparator 11. Thus, the output 17 of phase comparator 11 is an offset signal indicating the degree of variation between the reference signal 10 and the output of the VCO 13. This offset signal is used to drive the VCO 13 so that the output 14 of the VCO matches the reference clock signal 10.

The output of phase comparator 11 is also coupled on line 20 to A/D 21. The offset voltage is converted to a digital word which is inputted to memory 23. This digital word is outputted to D/A 24, converted to analog form, and outputted on line 18.

Switch 16 connects VCO 13 to line 17 or 18 depending on the mode of operation. If the reference clock signal 10 is available, switch 16 couples VCO 13 to line 17. If the detector 12 detects a degradation or loss of reference clock signal 10, the control signal on line 19 causes switch 16 to couple VCO 13 to line 18 (the output of D/A 24). In this phase of operation, a valid, predetermined value which had been stored in memory 23 is used as the offset value for VCO 13. The output 14 generated by this offset value is then used as the clock signal output of the device.

Their are several disadvantages associated with the prior art clock holdover circuit of FIG. 1. The A/D 21, the D/A 24 and VCO 13 all have performance characteristics that vary with time and temperature. Specifically, such parts are subject to aging variations as well as variations in performance and tolerances as a result of temperature swings in the environment. Therefore, although the digital offset value stored in memory 23 may be accurate at the time the reference clock signal is lost, if the environment of the circuit is changed, or there is an extended period of time in which the reference clock signal is lost, the output of the VCO 13 becomes unreliable. In certain telecommunications applications, very high accuracies are required. For example, for a clock holdover circuit supplementing a stratum 3 clock signal, accuracies in the range of a few parts per 10 million are required. Because the aging characteristics and temperature characteristics of the respective components are not linear or consistent, it is impossible to accurately predesign tolerances into such a system.

The present invention avoids the problems of time and temperature dependence in a clock holdover circuit by utilizing digital circuitry and having only a single time/temperature dependant component whose tolerances are known and within acceptable limits. The present invention uses a local crystal reference with an accuracy less than 1 part per 10 million. The output of this local clock is frequency compared to the input reference clock signal to generate an offset frequency. The offset frequency controls a digital up/down counter which output controls a frequency synthesizer. The frequency synthesizer outputs the digitized representation of the offset frequency and is constantly updated. Digital storage is utilized to store the most recent valid offset frequency. If the input reference signal is lost or fails, the digitally stored frequency is combined with the local clock reference to output the desired clock signal. The digital components are time and temperature independent. Therefore, the only variable in the circuit of the present invention is the local clock reference. By selecting a crystal reference whose accuracy is within the desired window, a highly accurate clock holdover signal is provided. The present invention also provides for phase accuracy so that upon loss of signal, phase integrity is not lost.

Figure 2:
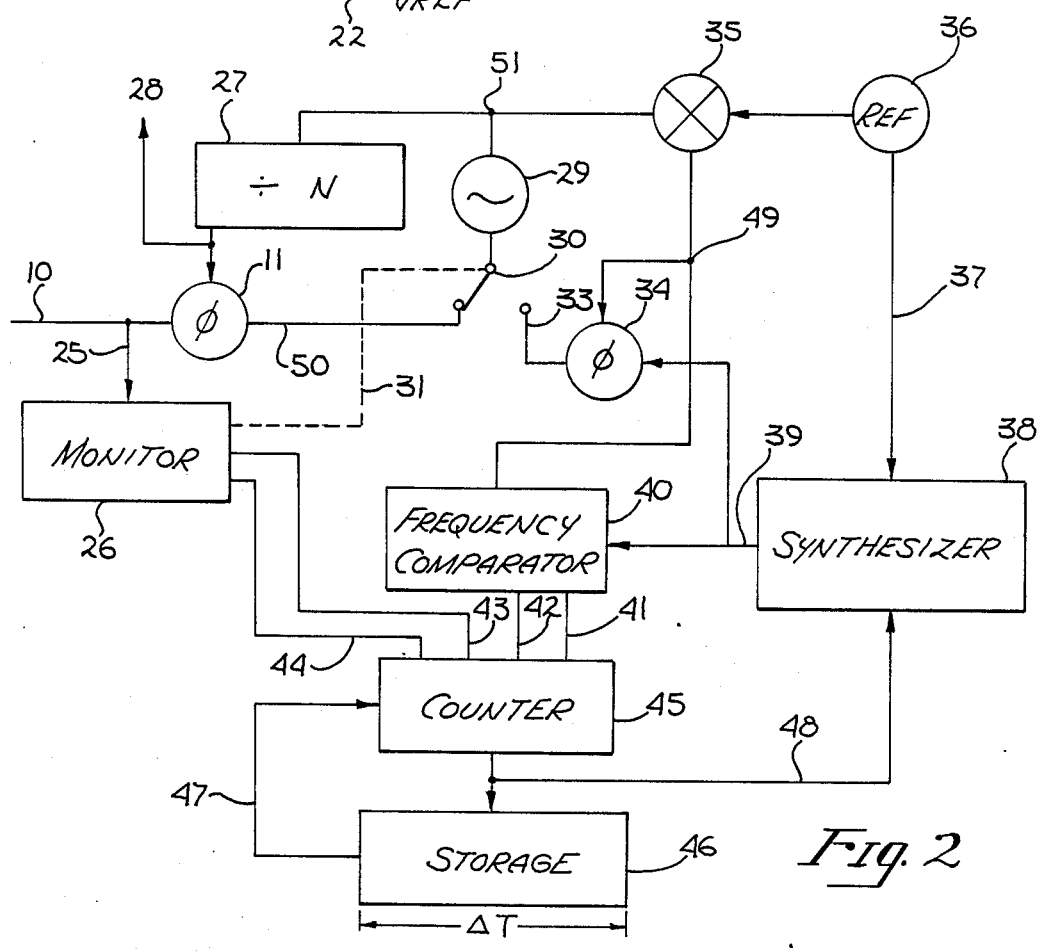
FIG. 2 is a block diagram illustrating the clock holdover circuit of the present invention.

The preferred embodiment of the present invention is illustrated in FIG. 2. Reference signal 10 is inputted to a phase comparator 11 whose output 50 is used to drive a VCO 29. VCO 29 may be a VCXO (voltage control crystal oscillator) if desired or any other suitable frequency generating means which may be phased locked to the input reference 10. The output of VCO 29 at node 51 is inputted to divider 27. VCO 29 may have a nominal frequency greater than or less than the frequency of the input reference 10. In the preferred embodiment of the present invention, the nominal frequency of VCO 29 is greater than the input reference 10. Therefore, the frequency must be divided by divider 27. The output 28 of divider 27 is inputted to phase comparator 11 to provide phase locking with input reference frequency 10. The output of the divider 27 is also the output of the clock holdover circuit. Generally, on start up, the output 28 is squelched until it is phase locked to the input reference 10.

The output of phase comparator 11 is coupled to VCO 29 through switch 30. A monitor 26 monitors the input reference frequency 10. If the input reference frequency is accurate to within the desired range (approximately plus or minus 15 ppm) then the VCO 29 is phase locked to the reference input 10 so that the output 28 is in phase with the input reference. A monitor 26 constantly tests both the presence and the accuracy of the input reference frequency 10. If the input signal is lost or becomes invalid, monitor 26 outputs a control signal on line 31 to couple switch 30 to the internal frequency reference of the clock holdover circuit of the present invention.

If the input frequency reference 10 is defined as $F_0$ then the output of VCO 29 is some multiple "N" of $F_0$. Thus the output at node 51 of VCO 29 is $NF_0$. This value is inputted to mixer 35. The clock holdover circuit of the present invention utilizes a frequency reference 36 which in the preferred embodiment is a crystal based reference having tolerance within the desired tolerances of the input reference signal 10. The nominal frequency of the reference 36 is $NF_0 + F_{off}$. Thus, the output of mixer 35 at node 49 is $F_{off}$; the offset between the phase locked nominal frequency of the VCO 29 and the local reference 36.

The output 37 of local frequency reference 36 is inputted to frequency synthesizer 38. The synthesizer 38 generates a synthesized frequency which is nominally equal to $F_{off}$. The synthesizer offset frequency $F_{offs}$ at node 39 is coupled to frequency comparator 40 along with the output 49 of mixer 35. Frequency comparator 40 selects one of outputs 41 and 42 depending on if $F_{off}$ is greater than or less than $F_{offs}$. The output of frequency comparator 40 causes counter 45 to count up or down in an amount equal to the value on selected output 41 or 42. This digital count represents the difference between $F_{off}$ and $F_{offs}$. The output of counter 45 is coupled to storage register 46, which in the preferred embodiment of the present invention is a FIFO register. The output of counter 45 on line 48 is also coupled to synthesizer 38 to provide a compensation value so that $F_{offs}$ will equal $F_{off}$.

Monitor 26 outputs a count enable signal on line 43 enables counter 45. When input reference frequency 10 is valid, count enable signal 43 enables counter 45 so that a valid compensation value can be generated for the local reference 36. Upon loss of input reference frequency 10, or if input frequency 10 becomes invalid, monitor 26 outputs a parallel load enable signal on line 44 to counter 45. This enables the most recently stored count in register 46 to be loaded to counter 45. This count is output on line 48 to synthesizer 38. The output of synthesizer 38 at node 39 is coupled to phase comparator 34 along with the output of mixer 35. The output 33 of phase comparator 34 is coupled through switch 30 to VCO 29. VCO 29 is then locked to the local reference 36. Because the local reference 36 has been phase locked to the circuit output, upon switching from the input reference frequency 10 to the local reference 36, phase continuity is maintained.

Figure 3D:
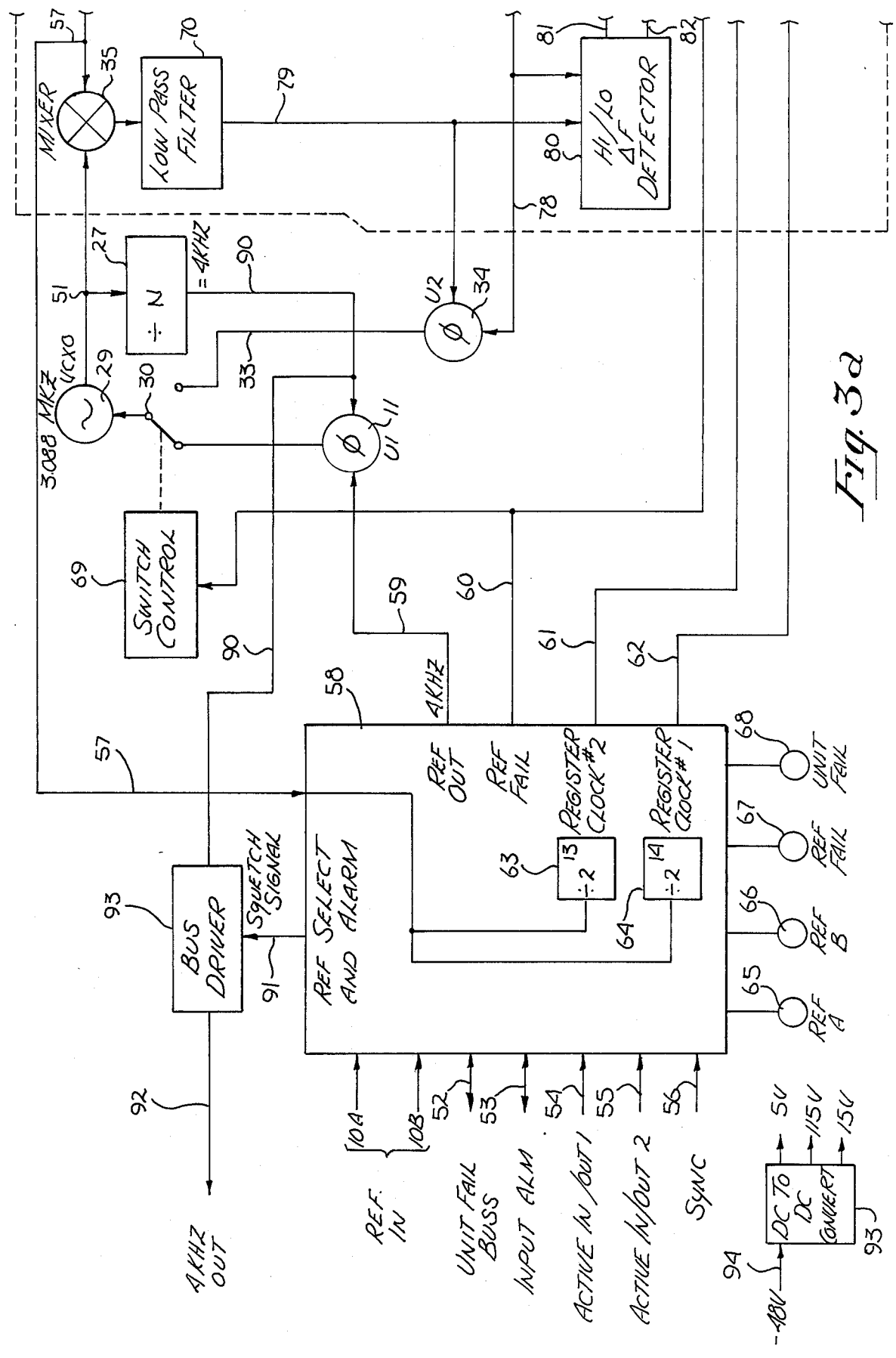
FIGS. 3a and 3b are block diagrams illustrating an alternate embodiment of the clock holdover circuit of the present invention.
Figure 3B:
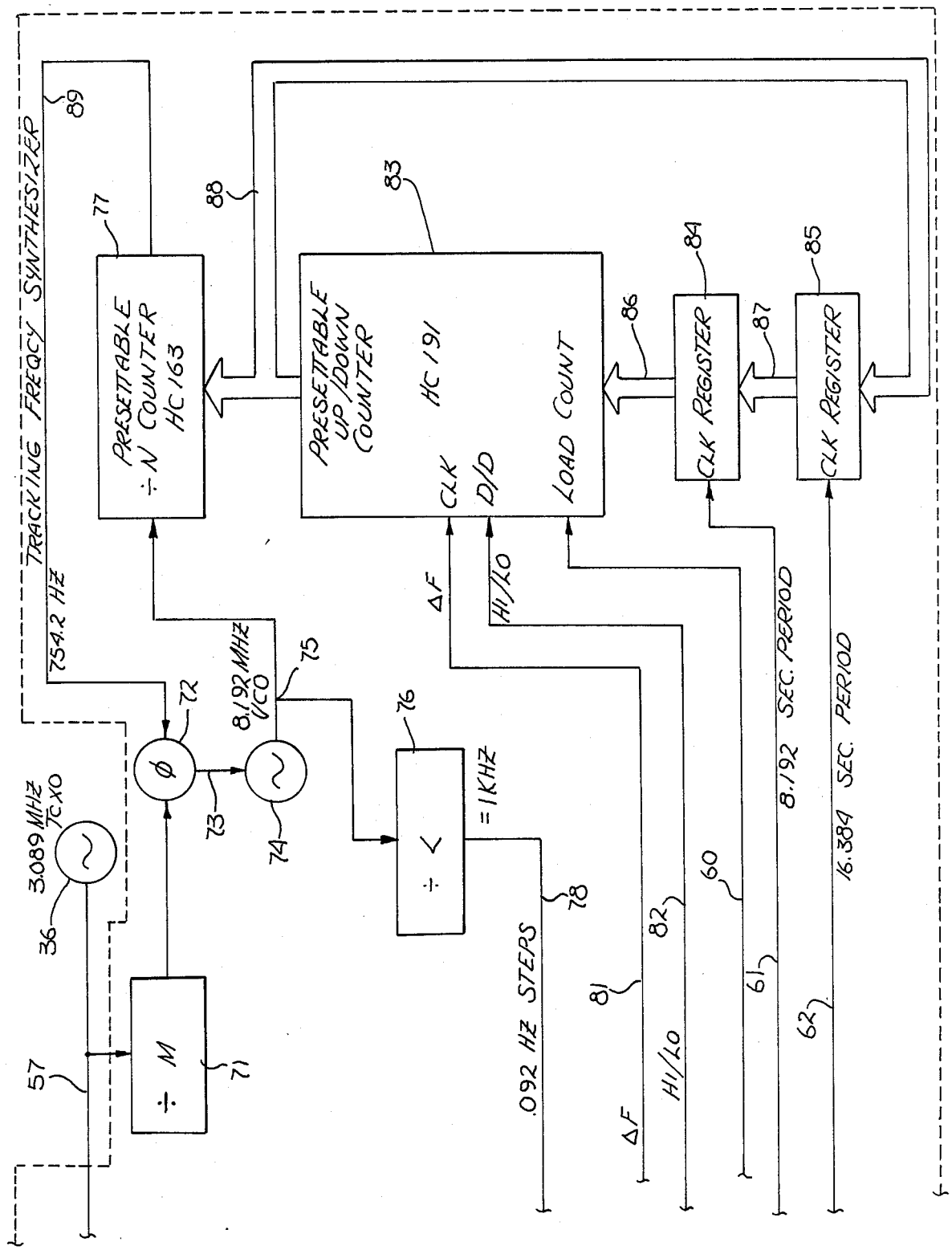

An alternate embodiment of the present invention is illustrated in FIGS. 3a and 3b. In the description of this alternate embodiment, specific frequency values are set forth by way of example only. It would be obvious, to one skilled in the art, that any suitable frequency values may be utilized with the circuitry of the present invention. As previously described, the present invention has particular application in a telecommunications environment and in particular as a clock holdover circuit for a stratum 3 clock hierarchy. Two input reference signals 10a and 10b are provided to a reference select circuit 58. The reference select circuit 58 selects the primary reference 10a or the backup reference 10b. The selected input is indicated by optional LED's 65 and 66 which indicate the selection of reference 10a and 10b respectively. Reference select circuit 58 includes means for determining the accuracy of the selected input signal 10a or 10b. Until the accuracy of the input signal can be determined, a squelch signal 91 is outputted to bus driver 52, suppressing the output 92 of the circuit. Reference select 58 outputs an input alarm 53 and a unit failure signal 52. Optional LED's 67 and 68 indicate the status of the input alarm and unit failure signals respectively. Active in/out signals 54 and 55 provide information to the reference select 58 on the status of the reference signal. A low signal on these inputs indicate reference signal failures. Sync input 56 is provided so that the active in/out signals 54 and 55 come up in phase with the input reference signal 10a and 10b.

After one of the input reference signals 10a and 10b is selected, the signal is output on line 59 to phase comparator 11. In a stratum 3 context, the nominal frequency of this output 59 is 4 KHZ. The output of phase comparator 11 is coupled through switch 30 to VCO 29 which generates a 3.088 MHZ output. The output of VCO 29 at node 51 is coupled to divide by N 27 where N equals 772. The output 90 of divider 27 is nominally 4 KHZ. This output is coupled to phase comparator 11 to complete the phase lock loop. The output 90 is also coupled to bus driver 93, whose output 92 is a 4 KHZ clocking signal.

The output of VCO 29 is also coupled to mixer 35 where it is combined with the output 57 of local frequency reference 36. In this example, local reference 36 is a crystal oscillator having a 3.089 MHZ output. Thus, the output of mixer 35 is a nominal 1 KHZ value. This output is coupled to low pass filter 70. The output 79 of low pass filter 70 is coupled to detector 80.

The output 57 of local reference 36 is coupled to divide by M 71 where M equal 4096. The output of divider 71 is coupled to phase comparator 72. The output 73 of phase comparator 72 is coupled to VCO 74 which outputs an 8.192 MHZ signal 75 in this example. This output 75 is coupled to divide by L 76 where L equals 8192. The output of divider 76 is a nominal 1 KHZ value 78 which is coupled to detector 80.

Detector 80 determines the positive and negative frequency difference between the low pass filter output 79 and divider output 78. Detector 80 outputs a frequency difference signal 81 and a high/low signal 82 to a pre-settable up/down counter 83.

The output 88 of counter 83 is coupled to a pre-settable divide by N counter 77. The output 75 of VCO 74 is also coupled to divide by N counter 77. The value of N can be changed to lock the local reference 36 to the selected input reference 10a or 10b (in actuality, pre-settable divide by N counter 77 is used to drive the nominal 1 KHZ output 78 to match the nominal 1 KHZ output 79). The output 89 of divider 77 is coupled to phase comparator 72 to complete the phase locked loop.

During regular operation, the difference (nominally 1 KHZ) between the VCO 29 and local reference 36 is compared to the synthesized 1 KHZ signal. The difference drives an up/down counter to converge the synthesized 1 KHZ signal with the difference between the VCO 29 and local reference 36. The resolution of the 1 KHZ synthesizer is 0.092 HZ which provides three parts in one hundred million accuracy.

The output 57 of local reference 36 is coupled to reference select circuit 58. This signal is coupled to divider 63 and 64 (dividing by $2^{13}$ and $2^{14}$ respectively) and outputting register clock signal 61 and 62 respectively. Signals 61 and 62 update the two storage registers 84 and 85. Signals 61 and 62 are coupled to registers 84 and 85 respectively. The most recent count 88 required to cause the synthesized 1 KHZ value 78 to converge on the 1 KHZ output 79 is stored in register 85. Typically, counter 83 relies on inputs 81 and 82. When an input reference failure or invalidity is detected, reference select 58 outputs reference failure 60 which is coupled to the load count input of counter 83. This disables the inputs 81 and 82 and causes counter 83 to load the contents of register 84 to counter 83. The contents of register 84 contain the most recent count required to converge the synthesized 1 KHZ value to the reference 1 KHZ value. Therefore, during a reference failure, the clock holdover circuit of the present invention continues to output an accurate clock signal. The count storage and frequency synthesis is digital, with the only variable being the local reference source 36. By pre-selecting a local reference within acceptable limits, the clock holdover circuit of the present invention outputs a suitable frequency reference signal irrespective of time and temperature variations. Time variations in frequency are smoothed by approximately a two minute time constant with the difference data being stored in registers 84 and 85. If both input references 10a and 10b fail, the VCO 29 is phase locked to the internal frequency synthesizer which uses the data stored in registers 84 and 85 to replace the missing inputs. During such a transition period, output 92 remains uninterrupted with a phase slip of less than one micro second.

Thus, a clock holdover circuit in which time and temperature variations are limited has been provided.

What is claimed is:

1. A clock holdover circuit comprising:
   receiving means for receiving a first clock signal having a first frequency and a first phase, said receiving means for detecting the presence and absence of said first clock signal and the accuracy of said first clock signal;
   first phase comparing means coupled to said first clock signal and through a switch means to a first frequency generating means, said phase comparing means outputting a first output signal to said first frequency generating means, said first frequency generating means outputting a second output signal to said first phase comparing means in a feedback loop;
   second frequency generating means outputting a third output signal having a second frequency and phase coupled to mixing means, said second output signal coupled to said mixing means, said mixing means outputting a fourth output signal representing a difference in frequency between said second and third output signals;
   frequency synthesizing means coupled to said second frequency generating means, said frequency synthesizing means outputting a fifth output signal representing a nominal difference between said second and third output signals;
   frequency comparing means coupled to said fourth and fifth output signals and outputting a sixth output signal representing a difference between said fourth and fifth output signals;
   storage means coupled to said sixth output signal and a first control signal, for storing said sixth output signal, said storge means coupled to said frequency synthesizing means;
   second phase comparing means coupled to said fourth and fifth output signals, said second phase comparing means outputting a seventh output signal;
   said receiving means outputting said first control signal to couple a stored value of said sixth output signal to said first frequency synthesizing means and outputting a second control signal to couple said switch means to said seventh output signal when said first clock signal is absent and when said first clock signal is not accurate.

2. The circuit of claim 1 wherein said first frequency generating means comprises a voltage controlled oscillator.

3. The circuit of claim 1 wherein said second frequency generating means comprises a crystal base frequency reference.

4. The circuit of claim 1 wherein said freuqency comparing means comprises a digital frequency comparator.

5. The circuit of claim 1 wherein said frequency synthesizing means comprises a digital frequency synthesizer.

6. A clock holdover circuit comprising:
   a first frequency generating means phase locked to an input signal and producing a first output signal at a desired frequency;
   a first comparing means coupled to a local frequency standard and to said first output signal for generating a second output signal, said second output signal being an offset between said local frequency standard and said first output signal;
   storage means coupled to said first comparing means for storing said second output signal;
   a second frequency generating means coupled to said storage means, said second frequency generating means driven by said second output signal to produce a third output signal at said desired frequency when said input signal is not available.

7. The circuit of claim 6 wherein said first frequency generating means comprises a voltage controlled oscillator.

8. The circuit of claim 6 wherein said local frequency standard comprises a crystal based oscillator.

9. The circuit of claim 6 wherein said second frequency generating means comprises a digital frequency synthesizer.

* * * * *

UNITED STATES PATENT AND TRADEMARK OFFICE
CERTIFICATE OF CORRECTION

PATENT NO. : 4,849,993
DATED : July 18, 1989
INVENTOR(S) : Johnson et al

It is certified that error appears in the above-indentified patent and that said Letters Patent is hereby corrected as shown below:

In the drawings, sheet 2, Figure 3a, delete the legend "SqUETCH" associated with squelch signal 91, and insert in place thereof --SQUELCH--; also, delete the legend "3.088 MKZ VCXO" associated with VCO 29, and insert in place thereof --3.088 MHZ VCXO--.

In the drawings, sheet 3, Figure 3b, delete the legend "TRACKING FREQCY SYNTHESIZER" associated with the elements of Figures 3a and 3b enclosed in the dashed line, and insert in place thereof --TRACKING FREQUENCY SYNTHESIZER--; also, delete the legend "÷ <" associated with divide by L 76, and insert in place thereof --÷ L--.

UNITED STATES PATENT AND TRADEMARK OFFICE
CERTIFICATE OF CORRECTION

PATENT NO. : 4,849,993
DATED : July 18, 1989
INVENTOR(S) : Johnson et al

It is certified that error appears in the above-indentified patent and that said Letters Patent is hereby corrected as shown below:

In column 1, lines 22 and 24, delete "dependant" and insert in place thereof --dependent--;
line 43, delete "input" and insert in place thereof --output--;
line 67, delete "which is" and insert in place thereof --whose--.
In column 4, line 22, delete "Their" and insert in place thereof --There--;
line 47, delete "dependant" and insert in place thereof --dependent--;
line 54, delete "which" and insert in place thereof --whose--.
In column 5, line 52, after the word "than" delete "$F_{off}$" and insert in place thereof --$F_{offs}$--;
line 63, delete "enables" and insert in place thereof --to--.

Signed and Sealed this

Eighteenth Day of October, 1994

Attest:

BRUCE LEHMAN

*Attesting Officer*  *Commissioner of Patents and Trademarks*